(12) United States Patent  
Ozaki

(10) Patent No.: US 7,816,717 B2  
(45) Date of Patent: Oct. 19, 2010

(54) SEMICONDUCTOR MEMORY DEVICE

(75) Inventor: Tohru Ozaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 12/020,210

(22) Filed: Jan. 25, 2008

(65) Prior Publication Data

US 2008/0179646 A1     Jul. 31, 2008

(30) Foreign Application Priority Data

Jan. 25, 2007     (JP)    ............................... 2007-014862

(51) Int. Cl.  
     *H01L 21/00*     (2006.01)  
     *H01L 29/76*     (2006.01)  
     *H01L 29/94*     (2006.01)

(52) U.S. Cl. ........................ 257/295; 257/296; 257/311; 257/905; 257/906; 257/908; 257/E21.009; 257/E21.664; 257/E21.665; 257/E27.104; 438/3; 438/4; 438/228; 438/239; 438/241; 365/97; 365/145; 365/149; 365/157; 365/158

(58) Field of Classification Search ................. 257/295, 257/296, 311, 905, 906, 908, E21.009, 327.664, 257/E21.665, E27.104; 365/97, 145, 149, 365/157, 158; 438/3, 4, 228, 239, 241  
See application file for complete search history.

(56) References Cited

U.S. PATENT DOCUMENTS 6,735,107 B1 *   5/2004   Takashima ................... 365/145  
6,759,251 B2 *   7/2004   Ozaki ............................. 438/3  
7,022,531 B2 *   4/2006   Ozaki et al. ..................... 438/3

FOREIGN PATENT DOCUMENTS

JP     2002-94022     3/2002

* cited by examiner

*Primary Examiner*—Dao H Nguyen  
(74) *Attorney, Agent, or Firm*—Finnegan, Henderson, Farabow, Garrett & Dunner, L.L.P.

(57) ABSTRACT

A semiconductor memory device, comprising: a semiconductor substrate; a memory cell section comprising a memory transistor provided on the semiconductor substrate, the memory transistor including a first gate electrode provided on the semiconductor substrate with a gate insulating film interposed therebetween, and a source and drain provided at both sides of the first gate electrode on the semiconductor substrate, and a ferroelectric capacitor provided above the memory transistor, the ferroelectric capacitor including a first electrode film connected to any one of a source and drain of the memory transistor, a second electrode film connected to the other one of the drain and source of the memory transistor, and a ferroelectric film provided between the first electrode film and the second electrode film, the memory cell section having the memory transistor and the ferroelectric capacitor connected in parallel to each other; and a select transistor section, comprising a select transistor provided at an end of the memory cell section, the select transistor including a second gate electrode provided on the semiconductor substrate with the gate insulating film interposed therebetween, and a source and drain provided at both sides of the second gate electrode on the semiconductor substrate, and a third electrode film connected to the source and drain of the select transistor and connected to a bit line via a bit line contact.

20 Claims, 8 Drawing Sheets

– continued –

SEMICONDUCTOR MEMORY DEVICE

CROSS-REFERENCE TO RELATED APPLICATION

This application is based upon and claims the benefit of priority from the prior Japanese Patent Application No. 2007-14862, filed on Jan. 25, 2007, the entire contents of which are incorporated herein by reference.

BACKGROUND OF THE INVENTION

1. Field of the Invention

The present invention relates to ferroelectric memory devices.

2. Description of the Related Art

Next generation nonvolatile memories are under development for the purpose of achieving the capacity, speed, and costs equal to those of DRAM. Such next generation nonvolatile memories are characterized by being capable of higher-speed rewriting than conventional EEPROM and flash memories, and of rewriting a greater number of times by five digits or more than these conventional ones. The next generation nonvolatile memories include a ferroelectric random access memory (FeRAM), a magnetic random access memory (MRAM), a phase change random access memory (PRAM) and a resistive random access memory (RRAM). From a viewpoint of area penalty, what is termed as a capacitor-on-plug (COP) capacitor structure is employed for the FeRAM, which is a ferroelectric memory. In the COP capacitor structure, a capacitor electrode and a source or drain of a memory transistor are electrically connected to each other by means of a conductive contact plug (via). Moreover, there is also another released nonvolatile memory called a series connected TC unit type FeRAM (also called a chain FeRAM). In the series connected TC unit type FeRAM, a memory transistor and a ferroelectric capacitor are connected in parallel to each other in each of memory cells and the memory cells are connected to each other in series in order to increase the operation margin. The series connected TC unit type FeRAM requires a transistor for selecting a block consisting of a group of unit cells, and is particularly desired to be configured of separate transistors for a cell block on a bit line (BL) side and a cell block on a bit line bar (BL/) side. This configuration, however, also inevitably requires a select transistor for each block of unit cells having an electric current passing therethrough, and the provision of the select transistors for the unit cells results in an increase of the area of a memory cell. As a method for reducing the area penalty, there has been proposed a method for forming a jumper wiring by using a plug and a lower electrode in a series connected TC unit type FeRAM obtained by forming the upper electrode and lower electrode through the processing in separate steps (for example, see Japanese Patent Application Laid-open Publication No. 2002-94022).

The series connected TC unit type FeRAM described in Japanese Patent Application Laid-open Publication No. 2002-94022 or other similar documents, however, has a problem that downsizing of a memory cell leads to an absence of a margin for an error in alignment of the upper electrode and the lower electrode, which makes the further size reduction difficult.

SUMMARY OF THE INVENTION

According to an aspect of the present invention, there is provided a semiconductor memory device, comprising:

a semiconductor substrate;
a memory cell section comprising
a memory transistor provided on the semiconductor substrate, the memory transistor including a first gate electrode provided on the semiconductor substrate with a gate insulating film interposed therebetween, and a source and drain provided at both sides of the first gate electrode on the semiconductor substrate, and
a ferroelectric capacitor provided above the memory transistor, the ferroelectric capacitor including a first electrode film connected to any one of a source and drain of the memory transistor, a second electrode film connected to the other one of the drain and source of the memory transistor, and a ferroelectric film provided between the first electrode film and the second electrode film,
the memory cell section having the memory transistor and the ferroelectric capacitor connected in parallel to each other; and
a select transistor section, comprising
a select transistor provided at an end of the memory cell section, the select transistor including a second gate electrode provided on the semiconductor substrate with the gate insulating film interposed therebetween, and a source and drain provided at both sides of the second gate electrode on the semiconductor substrate, and
a third electrode film connected to the source and drain of the select transistor and connected to a bit line via a bit line contact.

According to another aspect of the present invention, there is provided a semiconductor memory device, comprising:

a semiconductor substrate;
a memory cell section, comprising
a memory transistor provided on the semiconductor substrate, the memory transistor including a first gate electrode provided on the semiconductor substrate with a gate insulating film interposed therebetween, and a source and drain provided at both sides of the first gate electrode on the semiconductor substrate; and
a ferroelectric capacitor in which a first lower electrode film, a first ferroelectric film and a first upper electrode film are formed by deposition, the first lower electrode film connected to any one of the source and drain of the memory transistor,
the memory cell section having the memory transistor and the ferroelectric capacitor connected in parallel to each other; and
a select transistor section, comprising
a select transistor provided at an end of the memory cell section, the select transistor including a second gate electrode provided on the semiconductor substrate with the gate insulating film interposed therebetween, and a source and drain provided at both sides of the second gate electrode on the semiconductor substrate, and
a jumper wiring section including a second lower electrode film, a second ferroelectric film, a second upper electrode film, and a bit line contact, the second lower electrode connected to the source and drain of the select transistor, and the bit line contact connected to the second lower electrode.

According to another aspect of the present invention, there is provided a semiconductor memory device, comprising:

a semiconductor substrate;
a memory cell section, comprising
a memory transistor provided on the semiconductor substrate, the memory transistor including a first gate electrode provided on the semiconductor substrate with a gate insulating film interposed therebetween, and a source and drain provided at both sides of the first gate electrode on the semiconductor substrate; and a ferroelectric capacitor in which a first lower electrode film, a ferroelectric film, and a first upper electrode film are formed by deposition, the first lower electrode film connected to any one of the source and drain of the memory transistor, the memory cell section having the memory transistor and the ferroelectric capacitor connected in parallel to each other; and a select transistor section, comprising a select transistor provided at an end of the memory cell section, the select transistor including a second gate electrode provided on the semiconductor substrate with the gate insulating film interposed therebetween, and a source and drain provided at both sides of the second gate electrode on the semiconductor substrate, and a jumper wiring section including a second lower electrode film, a second upper electrode film, and a bit line contact, the second lower electrode connected to the source and drain of the select transistor, and the bit line contact connected to the second upper electrode connected to the second lower electrode.

DESCRIPTION OF THE EMBODIMENTS

Hereinafter, embodiments of the present invention will be described with reference to the accompanying drawings.

Embodiment 1

Figure 1:
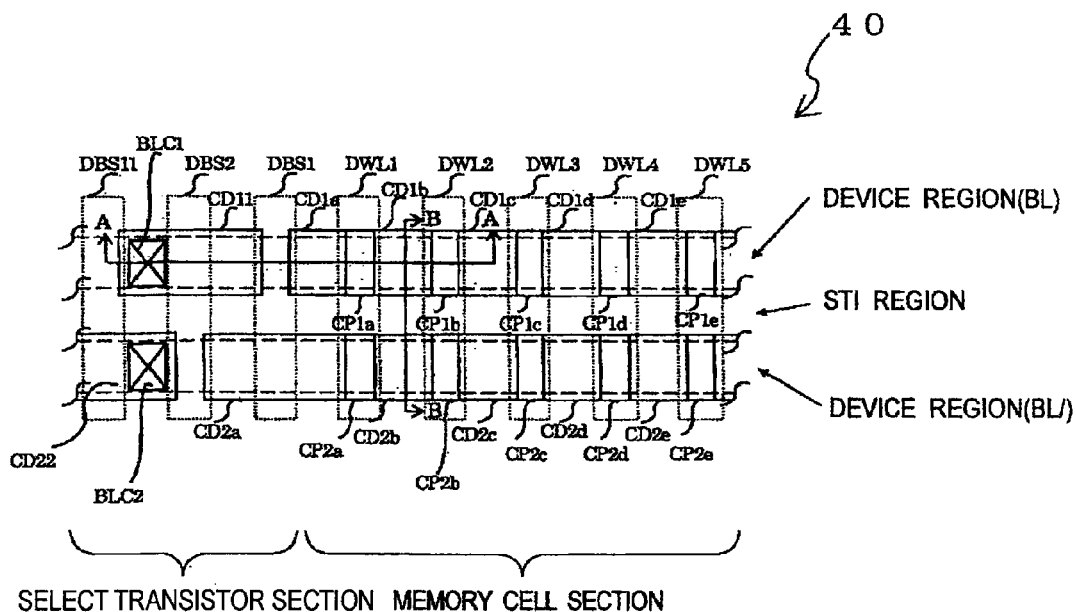
FIG. 1 is a top view showing a memory cell section and a select transistor section of a ferroelectric memory concerning Embodiment 1 of the present invention.
Figure 2:
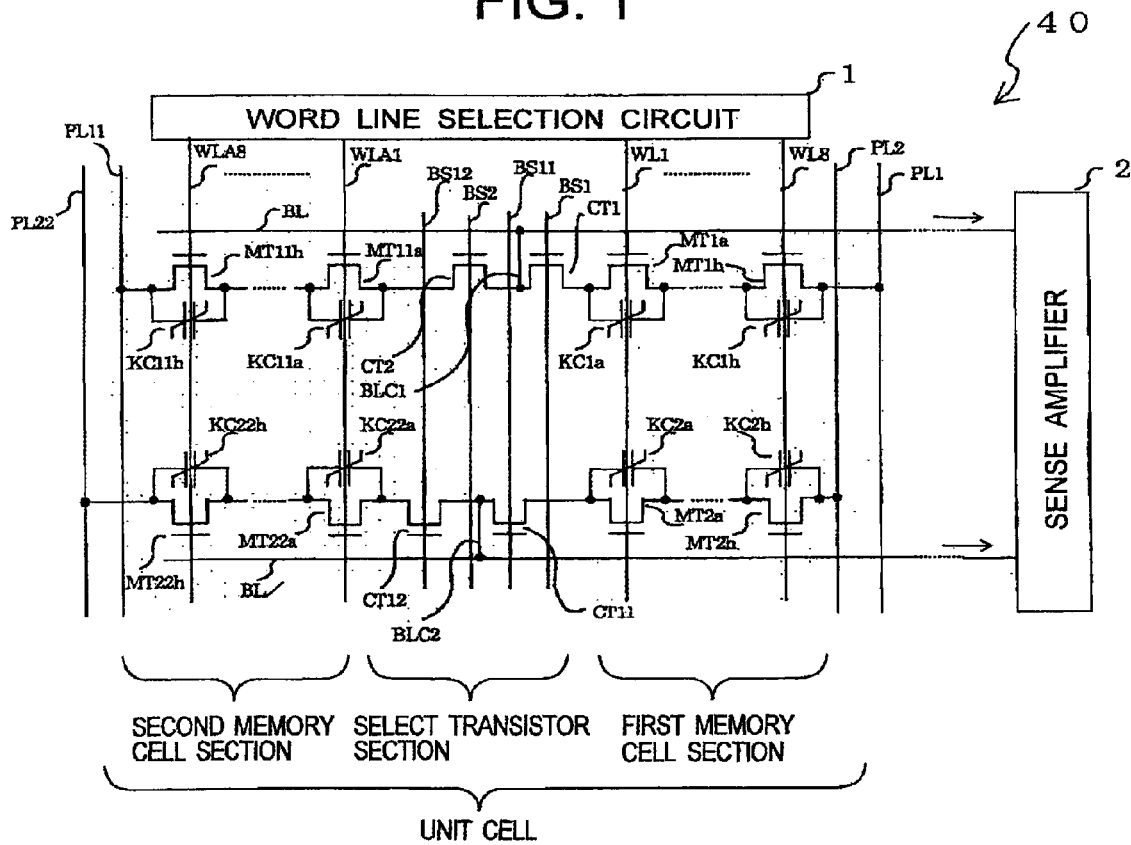
FIG. 2 is a circuit diagram showing the ferroelectric memory concerning Embodiment 1 of the present invention.
Figure 3:
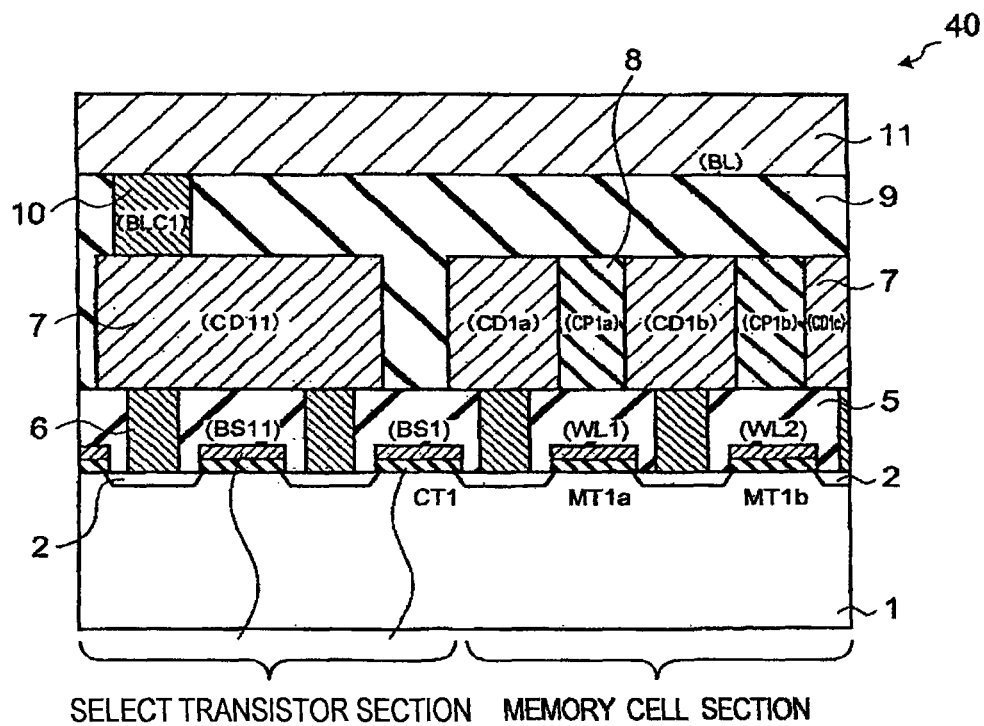
FIG. 3 is a cross sectional view showing the memory cell section and the select transistor section of the ferroelectric memory along an A-A line of FIG. 1.
Figure 4:
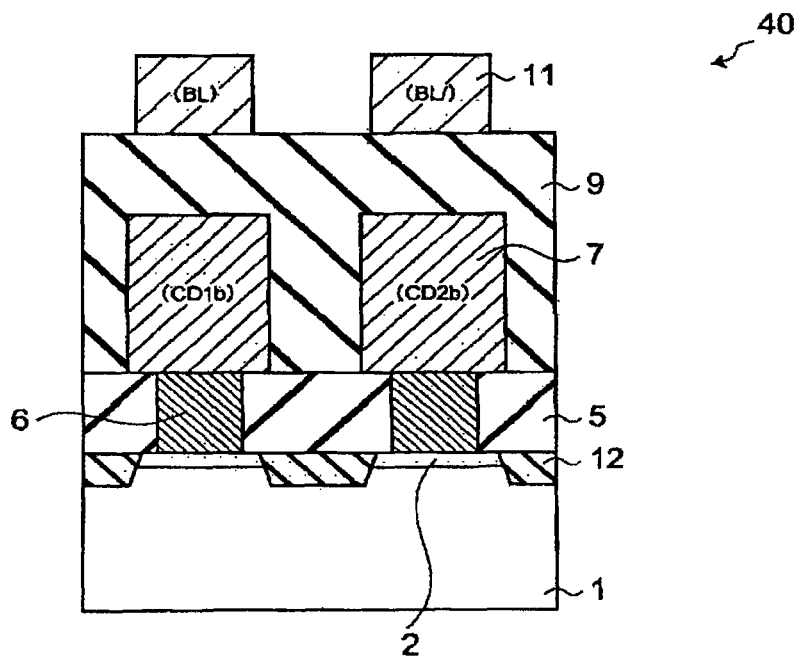
FIG. 4 is a cross sectional view showing the memory cell section of the ferroelectric memory along a B-B line of FIG. 1.

First, a semiconductor memory device and a method of producing the semiconductor memory device concerning Embodiment 1 of the present invention are described with reference to the accompanying drawings. FIG. 1 is a top view showing a memory cell section and a select transistor section of a ferroelectric memory. FIG. 2 is a circuit diagram showing the ferroelectric memory. FIG. 3 is a cross sectional view showing the memory cell section and the select transistor section of the ferroelectric memory along an A-A line of FIG. 1. FIG. 4 is a cross sectional view showing the memory cell section of the ferroelectric memory along a B-B line of FIG. 1. In this embodiment, a jumper wiring and a capacitor electrode of a chain ferroelectric random access memory (a chain FeRAM) are formed in the same process step. The chain FeRAM is a series connected TC unit type FeRAM wherein a memory cell in which a memory transistor and a ferroelectric capacitor are connected in parallel to each other is connected in series.

As shown in FIG. 1, device regions isolated by a shallow trench isolation (STI) region are provided in a ferroelectric memory (chain FeRAM) 40. A jumper wiring CD11, capacitor electrodes CD1a to CD1e, and ferroelectric films CP1a to CP1e are provided in a device region (bit line BL). A jumper wiring CD22, capacitor electrodes CD2a to CD2e, and ferroelectric films CP2a to CP2e are provided in a device region (bit line BL/).

The jumper wiring CD11 is connected to a non-illustrated bit line BL via a bit line contact BLC1, and the jumper wiring CD22 is connected to a non-illustrated bit line BL/ via a bit line contact BLC2.

The capacitor electrode CD1a, ferroelectric film CP1a, and capacitor electrode CD1b constitute a ferroelectric capacitor, and the capacitor electrode CD2a, ferroelectric film CP2a, and capacitor electrode CD2b constitute a ferroelectric capacitor. The capacitor electrode CD1b, ferroelectric film CP1b, and capacitor electrode CD1c constitute a ferroelectric capacitor, and the capacitor electrode CD2b, ferroelectric film CP2b, and capacitor electrode CD2c constitute a ferroelectric capacitor. The capacitor electrode CD1c, ferroelectric film CP1c, and capacitor electrode CD1d constitute a ferroelectric capacitor, and the capacitor electrode CD2c, ferroelectric film CP2c, and capacitor electrode CD2d constitute a ferroelectric capacitor. The capacitor electrode CD1d, ferroelectric film CP1d, and capacitor electrode CD1e constitute a ferroelectric capacitor, and the capacitor electrode CD2d, ferroelectric film CP2d, and capacitor electrode CD2e constitute a ferroelectric capacitor.

In the device region (bit line BL) and the device region (bit line BL/), which are arranged in parallel in the horizontal direction, select line electrodes DBS1, DBS11, and DBS2 and word line electrodes DWL1 to DWL5 are arranged in parallel in the longitudinal direction with a space from each other.

A select transistor is provided at portions where the select line electrodes DBS1, DBS11 and DBS2 in the select transistor section intersect with the device region (bit line BL) and device region (bit line BL/). A memory transistor is provided at portions where the word line electrodes DWL1 to DWL5 in the memory cell section intersect with the device region (bit line BL) and device region (bit line BL/). Here, word line electrodes after the word line electrode DWL5 are not illustrated.

As shown in FIG. 2, a unit cell, a word line selection circuit 1, and a sense amplifier 2 are provided in the ferroelectric memory (chain FeRAM) 40. A first memory cell section, the select transistor section, and a second memory cell section are provided in the unit cell.

In the first memory cell section, in parallel with the bit line BL, eight memory cells, in each of which a memory transistor and a ferroelectric capacitor are connected in parallel to each other, are connected in series (also, called cascade-connected). In parallel with the bit line BL/, eight memory cells, in each of which a memory transistor and a ferroelectric capacitor are connected in parallel to each other, are connected in series. The memory transistor MT1a and ferroelectric capacitor KC1a, the memory transistor MT1h and ferroelectric capacitor KC1h, the memory transistor MT2a and ferroelectric capacitor KC2a, the memory transistor MT2h and ferroelectric capacitor KC2h are connected in parallel to each other, respectively. Specifically, a source or drain of a memory transistor is connected to one end of a ferroelectric capacitor, and the other one of drain and source of the memory transistor is connected to other end of the ferroelectric capacitor.

The gates of the memory transistors MT1a and MT2a are connected to the word line WL1, and the gates of the memory transistors MT1h and MT2h are connected to the word line WL8. The memory transistor MT1h and ferroelectric capacitor KC1h are connected to a plate line PL1, and the memory transistor MT2h and ferroelectric capacitor KC2h are connected to a plate line PL2.

In the second memory cell section, in parallel with the bit line BL, eight memory cells, in each of which a memory transistor and a ferroelectric capacitor are connected in parallel to each other, are connected in series. In parallel with the bit line BL/, eight memory cells, in each of which a memory transistor and a ferroelectric capacitor are connected in parallel to each other, are connected in series. The memory transistor MT11a and ferroelectric capacitor KC11a, the memory transistor MT11h and ferroelectric capacitor KC11h, the memory transistor MT22a and ferroelectric capacitor KC22a, the memory transistor MT22h and ferroelectric capacitor KC22h are connected in parallel to each other, respectively. Specifically, a source or drain of a memory transistor is connected to one end of a ferroelectric capacitor, and the other one of the drain and source of the memory transistor is connected to other end of the ferroelectric capacitor.

The gates of the memory transistor MT11a and MT22a are connected to a word line WLA1, and the gates of the memory transistor MT11h and MT22h are connected to a word line WLA8. The memory transistor MT11h and ferroelectric capacitor KC11h are connected to a plate line PL11, and the memory transistor MT22h and ferroelectric capacitor KC22h are connected to a plate line PL22.

The select transistor section is provided between the first memory cell section and the second memory cell section. Select transistors CT1 and CT2 connected in series (also, called cascade-connected) are provided in parallel with the bit line BL, and select transistors CT11 and CT12 connected in series are provided in parallel with the bit line BL/.

The gate of the select transistor CT1 is connected to a select line BS1, the gate of the select transistor CT2 is connected to a select line BS2, the gate of the select transistor CT11 is connected to a select line BS11, and the gate of the select transistor CT12 is connected to a select line BS12.

A source or drain of the select transistor CT1 is connected to the memory transistor MT1a and ferroelectric capacitor KC1a, a source or drain of the select transistor CT2 is connected to the memory transistor MT11a and ferroelectric capacitor KC11a, a source or drain of the select transistor CT11 is connected to the memory transistor MT2a and ferroelectric capacitor KC2a, and a source or drain of the select transistor CT12 is connected to the memory transistor MT22a and ferroelectric capacitor KC22a.

A source or drain between the select transistor CT1 and the select transistor CT2 is connected to the bit line BL via a bit line contact BCL1. A source or drain between the select transistor CT11 and the select transistor CT12 is connected to the bit line BL/ via a bit line contact BCL2.

The word line selection circuit 1 outputs a word line control signal to the gates of the memory transistors in the first and second memory cell sections via the word lines WL1 to WL8 and the word lines WLA1 to WLA8, respectively. The memory transistor in the first and second memory cell sections is turned "on" and "off" in response to the word line control signal to store information in the ferroelectric capacitor.

The sense amplifier 2 is connected to the bit line BL and the bit line BL/, and receives input, via the select transistor and the bit line contact, a data to be stored in the first and second memory cell sections, and amplifies and outputs the information thereof.

As shown in FIG. 3, in the ferroelectric memory (chain FeRAM) 40, on a semiconductor substrate 1, a source/drain region 2 of a memory transistor of the conductive type opposite to the semiconductor substrate 1 is selectively provided. Above a section between the source/drain region 2, a gate electrode film 4 is selectively provided via a gate insulating film 3. An interlayer insulating film 5 is provided so as to cover the source/drain region 2, the gate insulating film 3, and the gate electrode film 4.

An opening is provided in the interlayer insulating film 5 so as to expose a part of the source/drain region 2, and a via (plug) 6 is embedded into the opening. On the via (plug) 6, a capacitor electrode film 7 to be connected to the via (plug) 6, is provided. Note that the capacitor electrode film 7 provided above the source and drain sandwiching the select line BS11 serves as the jumper wiring CD11. Because the transistor whose gate is the select line BS11 is short-circuited by the jumper wiring CD11, the transistor is omitted from FIG. 2. The capacitor electrode film 7 above the source/drain region 2 between the select transistor CT1 and the memory transistor MT1a serves as the capacitor electrode CD1a. The capacitor electrode film 7 above the source/drain region 2 between the memory transistor MT1a and the memory transistor MT1b serves as the capacitor electrode CD1b.

Between the capacitor electrode film 7 serving as the capacitor electrode CD1a and the capacitor electrode film 7 serving as the capacitor electrode CD1b, a ferroelectric film 8

(corresponding to the ferroelectric film CP1a of FIG. 1) is selectively provided. Between the capacitor electrode films 7 serving as the capacitor electrode CD1b and the capacitor electrode film 7 serving as the capacitor electrode CD1c, the ferroelectric film 8 (corresponding to the ferroelectric film CP1b of FIG. 1) is selectively provided.

An interlayer insulating film 9 is provided on the interlayer insulating film 5, the capacitor electrode film 7, and the ferroelectric film 8. An opening is provided in the interlayer insulating film 9 so as to expose a part of the capacitor electrode film 7 serving as the jumper wiring CD11. A via (plug) 10 (corresponding to the bit line contact BLC1 of FIG. 1) is embedded into the opening. On the interlayer insulating film 9 and the via (plug) 10, a wiring layer 11 corresponding to the bit line BL to be connected to the via (plug) 10 is provided.

As shown in FIG. 4, in the ferroelectric memory (chain FeRAM) 40, the source/drain region 2 isolated by an STI (shallow trench isolation) 12 is provided on the semiconductor substrate 1. The via (plug) 6 is provided on the source/drain region 2, and the capacitor electrode film 7 to be connected to the via (plug) 6, is provided on the via (plug) 6. Above the capacitor electrode film 7 as the capacitor electrode CD1b, the wiring layer 11 as the bit line BL is provided via the interlayer insulating film 9. Above the capacitor electrode film 7 as the capacitor electrode CD2b, the wiring layer 11 as the bit line BL/ is provided via the interlayer insulating film 9.

Next, a method for producing the ferroelectric memory is described with reference to FIG. 5 to FIG. 9. FIGS. 5 to 9 are cross sectional views showing the production process of the ferroelectric memory.

Figure 5:
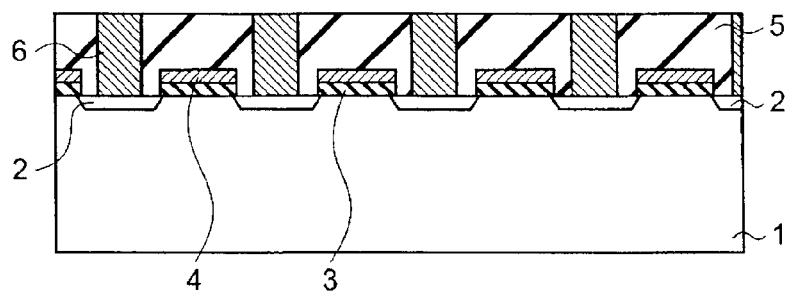
FIG. 5 is a cross sectional view showing a production process of the ferroelectric memory concerning Embodiment 1 of the present invention.

As shown in FIG. 5, first, the gate insulating film 3 and the gate electrode film 4 are selectively formed on the semiconductor substrate 1. The source/drain region 2 is formed on the semiconductor substrate 1 between the laminated gate insulating film 3 and gate electrode film 4. The interlayer insulating film 5 is formed on the source/drain region 2, the gate insulating film 3, and the gate electrode film 4. The interlayer insulating film 5 on the source/drain region 2 is opened by etching, and the via (plug) 6 composed of W (tungsten), for example, is embedded into the opening where a part of the source/drain region 2 is exposed.

Figure 6:
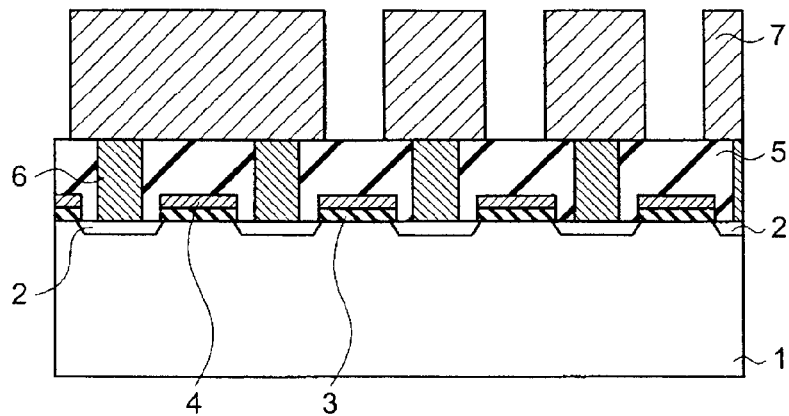
FIG. 6 is a cross sectional view showing a production process of the ferroelectric memory concerning Embodiment 1 of the present invention.

Next, as shown in FIG. 6, the capacitor electrode film 7 is formed on the interlayer insulating film 5 and the via (plug) 6. By etching using a reactive ion etching (RIE) method, for example, the capacitor electrode film 7 in portions except the region serving as the capacitor electrode is removed. In the RIE, it is preferable to use the condition under which the etching rate of the capacitor electrode film 7 can be made higher than that of the interlayer insulating film 5 (that is, the selection ratio is high). Although Pt (platinum) is used for the capacitor electrode film 7 here, Ir (iridium), $IrO_2$, or the like may be used.

Figure 7:
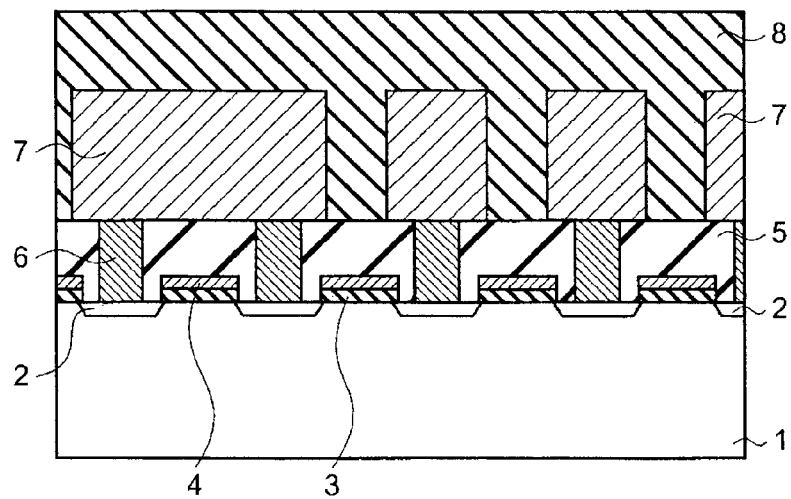
FIG. 7 is a cross sectional view showing a production process of the ferroelectric memory concerning Embodiment 1 of the present invention.

Next, as shown in FIG. 7, the ferroelectric film 8 is formed on the interlayer insulating film 5 and the capacitor electrode film 7. Although PZT (lead zirconate titanate, $PbZrTiO_3$) is used for the ferroelectric film 8 here, SBT (strontium bismuth tantalate, $SrBi_2Ta_2O_9$), BLT (lanthanum additive bismuth titanate $(Bi, La)_4Ti_3O_{12}$), or the like may be used.

Figure 8:
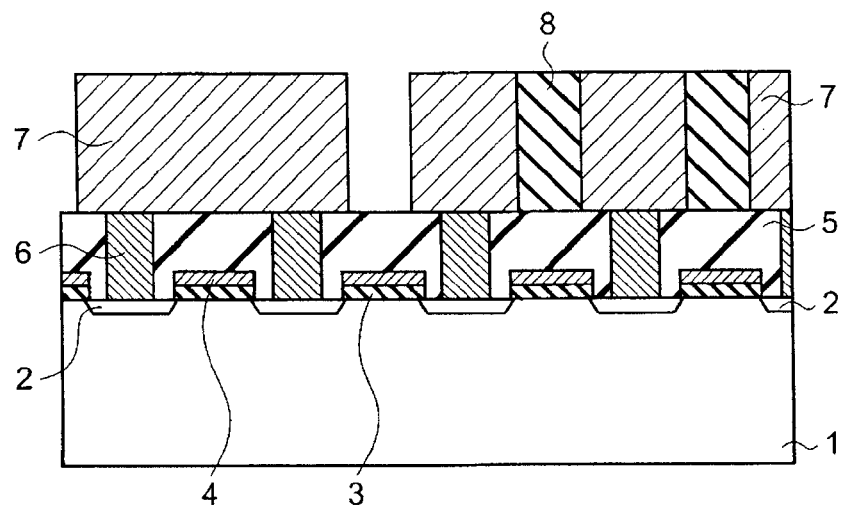
FIG. 8 is a cross sectional view showing a production process of the ferroelectric memory concerning Embodiment 1 of the present invention.

Then, as shown in FIG. 8, by etching using the RIE method, for example, the ferroelectric film 8 in portions except the region serving as the ferroelectric capacitor is removed. In the RIE, it is preferable to use the condition under which the etching rate of the ferroelectric film 8 can be made higher than those of the interlayer insulating film 5 and the capacitor electrode film 7 (that is, the selection ratio is high).

Figure 9:
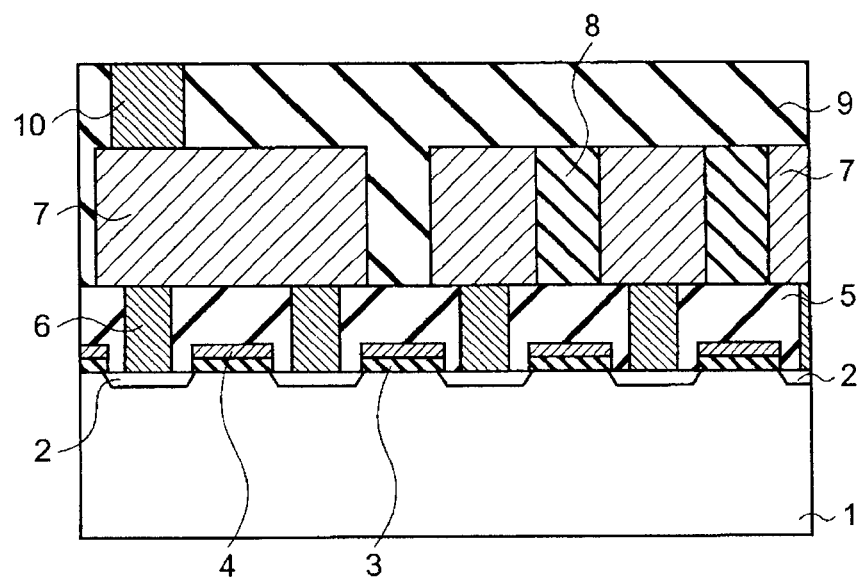
FIG. 9 is a cross sectional view showing a production process of the ferroelectric memory concerning Embodiment 1 of the present invention.

Next, as shown in FIG. 9, the interlayer insulating film 9 is formed on the interlayer insulating film 5, the capacitor electrode film 7, and the ferroelectric film 8. An opening is provided in the interlayer insulating film 9 so as to expose a part of the capacitor electrode film 7 serving as the jumper wiring CD11. Then, the via (plug) 10 is embedded into the opening. On the interlayer insulating film 9 and the via (plug) 10, the wiring layer 11 connected to the via (plug) 10 is formed. After the formation of the wiring layer 11, an interlayer insulating film, a wiring layer, and the like are formed using the well-known technique to complete the ferroelectric memory 40 as a chain FeRAM.

As described above, in the semiconductor memory device and a method of producing the semiconductor memory device according to this embodiment, there is provided, in the select transistor section, the capacitor electrode film 7 as the jumper wiring CD11 connected to the bit line BL via the via 10 as the bit line contact BLC1 and also connected to the via 6 formed on the source/drain region 2. In the memory cell section, a plurality of memory cells, in each of which a memory transistor and a ferroelectric capacitor are connected in parallel to each other, are connected in series. In the ferroelectric capacitor, in parallel with the semiconductor substrate 1, the capacitor electrode film 7 connected to the via 6 formed on the source/drain region 2 and the ferroelectric film 8 are formed alternately and repeatedly above the memory cell section (however, the capacitor electrode film 7 is formed in the terminating portion on both sides).

Accordingly, the jumper wiring in the select transistor section can be formed in the same process step as the capacitor electrode, so that even if the downsizing of the chain FeRAM progresses, the area of the select transistor section can be reduced with the same scalability as that of the memory cell section.

In addition, in this embodiment, eight (8 bits) memory cells, in each of which a memory transistor and a ferroelectric capacitor are connected in parallel to each other, are arranged in parallel with the bit line BL or the bit line BL/ and are connected in series. However, the present invention is not necessarily limited to this number, and any multiple number of memory cells may be established.

Embodiment 2

Figure 10:
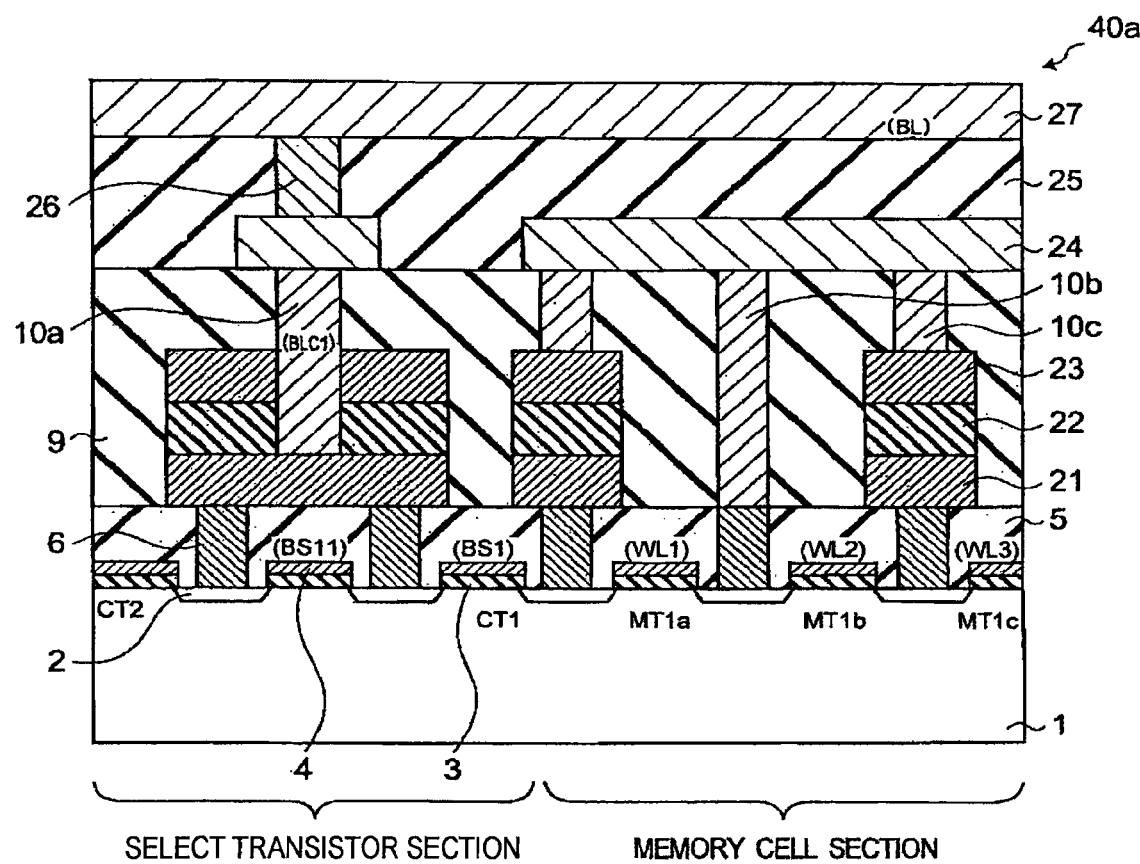
FIG. 10 is a cross sectional view showing a memory cell section and a select transistor section of a ferroelectric memory concerning Embodiment 2 of the present invention.

Next, a semiconductor memory device and a method of producing the semiconductor memory device concerning Embodiment 2 of the present invention are described with reference to the accompanying drawings. FIG. 10 is a cross sectional view showing a memory cell section and a select transistor section of the ferroelectric memory. In this embodiment, the structures of a ferroelectric capacitor as well as a jumper wiring section of the chain FeRAM as a ferroelectric memory are modified.

Hereinafter, component parts identical to those of Embodiment 1 are given the same reference numerals to omit the description thereof, and only different portions are described.

As shown in FIG. 10, in a ferroelectric memory (chain FeRAM) 40a, a lower electrode film 21 connected to the via (plug) 6 is provided above the select line BS11. The lower electrode film 21 connected to the via (plug) 6 is provided above the source/drain region 2 between the select transistor CT1 and the memory transistor MT1a. Also, the lower electrode film 21 connected to the via (plug) 6 is provided above the source/drain region 2 between the memory transistor MT1b and the memory transistor MT1c. Above the lower electrode film 21, a ferroelectric film 22 and an upper electrode film 23 are formed by lamination. The interlayer insulating film 9 is provided on the laminated lower electrode film 21, ferroelectric film 22, and upper electrode film 23 as well as on the interlayer insulating film 5.

Although Pt (platinum) is used for the lower electrode film 21 and upper electrode film 23 here, Ir (iridium), IrO₂, or the like may be used. Although PZT (lead zirconate titanate, PbZrTiO₃) is used for the ferroelectric film 22 here, SBT (strontium bismuth tantalate, SrBi₂Ta₂O₉), BLT (lanthanum additive bismuth titanate (Bi, La)₄Ti₃O₁₂), or the like may be used.

In the ferroelectric film 22, upper electrode film 23, and interlayer insulating film 9 provided above the select line BS11, an opening is provided so as to expose the lower electrode film 21. Then a via (plug) 10a as the bit line contact BLC1 is embedded into this opening. Above the via (plug) 6 between the memory transistor MT1a and the memory transistor MT1b, an opening is provided so as to expose the via (plug) 6. Then, a via (plug) 10b is embedded into this opening. On the upper electrode film 23 between the select transistor CT1 and the memory transistor MT1a as well as between the memory transistor MT1b and the memory transistor MT1c, an opening is provided, respectively, so as to expose the upper electrode film 23. Then, a via (plug) 10c is embedded into this opening. Here, the via (plug) 10a is connected to the lower electrode film 21, whereby a portion configured of the via (plug) 10a, lower electrode film 21, ferroelectric film 22, and upper electrode film 23 functions as the jumper wiring section.

A wiring layer 24 connected to the via (plug) 10a is provided on the via (plug) 10a, and the wiring layer 24 connected to the vias (plug) 10b and 10c is provided on the vias (plug) 10b and 10c. An interlayer insulating film 25 is provided on the interlayer insulating film 9 and the wiring layer 24. On the wiring layer 24 connected to the via (plug) 10a, an opening is provided so as to expose the wiring layer 24. Then, a via (plug) 26 is embedded into this opening. On the interlayer insulating film 25 and the via (plug) 26, a wiring layer 27 as the bit line BL to be connected to the via (plug) 26 is provided.

Next, a method of producing the ferroelectric memory is described with reference to FIG. 11 to FIG. 14. FIGS. 11 to 14 are cross sectional views showing the production process of the ferroelectric memory. Here, since the steps up to the step of forming the via (plug) 6 are the same as those of Embodiment 1, the description thereof is omitted.

Figure 11:
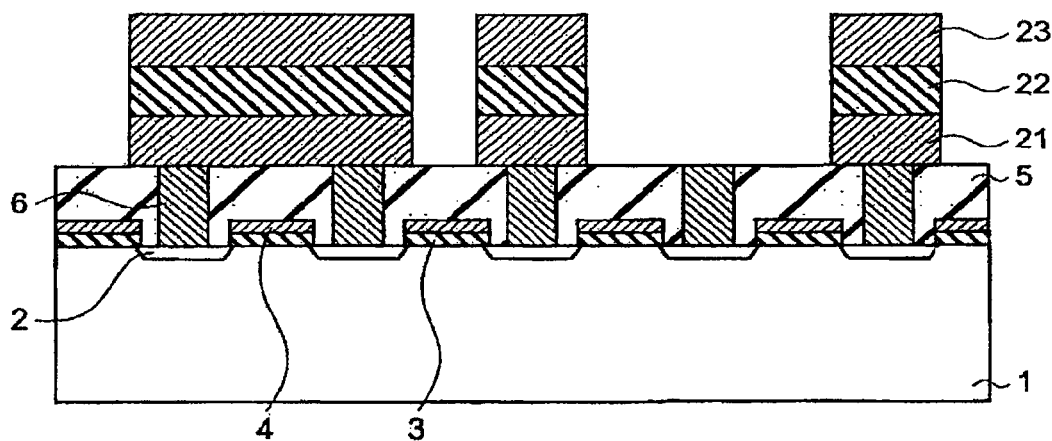
FIG. 11 is a cross sectional view showing a production process of the ferroelectric memory concerning Embodiment 2 of the present invention.

As shown in FIG. 11, the lower electrode film 21, the ferroelectric film 22, and the upper electrode film 23 are successively laminated. Then, by etching using the RIE method, for example, the lower electrode films 21, ferroelectric films 22, and upper electrode films 23 in portions except those in regions serving as the jumper wiring section and the ferroelectric capacitor are removed. In the RIE, it is preferable to use the condition under which the etching rates of the lower electrode film 21, ferroelectric film 22, and upper electrode film 23 can be made higher than that of the interlayer insulating film 5 (the selection ratio is high).

Figure 12:
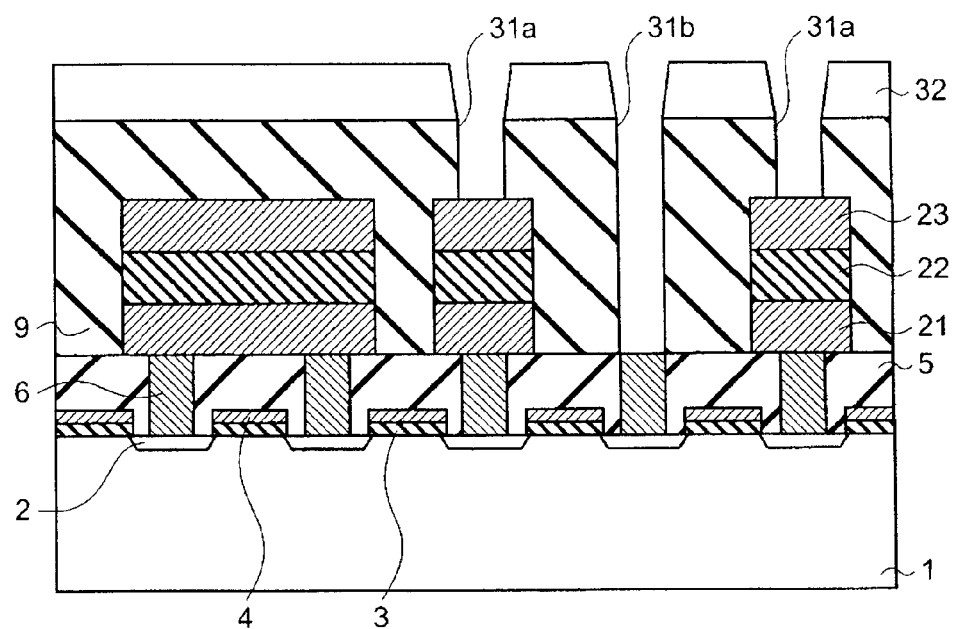
FIG. 12 is a cross sectional view showing a production process of the ferroelectric memory concerning Embodiment 2 of the present invention.

Next, as shown in FIG. 12, the interlayer insulating film 9 is formed on the interlayer insulating film 5, lower electrode film 21, ferroelectric film 22, and upper electrode film 23. For the purpose of forming the via opening in the memory cell section, a resist film 32 is formed using the well-known lithography technique. With this resist film 32 as a mask, the interlayer insulating film 9 is removed by etching using the RIE method, for example, to form the openings 31a and 31b. Here, the interlayer insulating film 9 in the portion of the opening 31b is thicker than the interlayer insulating film 9 in the portion of the opening 31a. Accordingly, in the RIE, it is preferable to use the condition where the etching rate of the interlayer insulating film 9 is higher than the etching rates of the via (plug) 6 and upper electrode film 23 (that is, the selection ratio is high). This resist film 32 is removed after the RIE.

Figure 13:
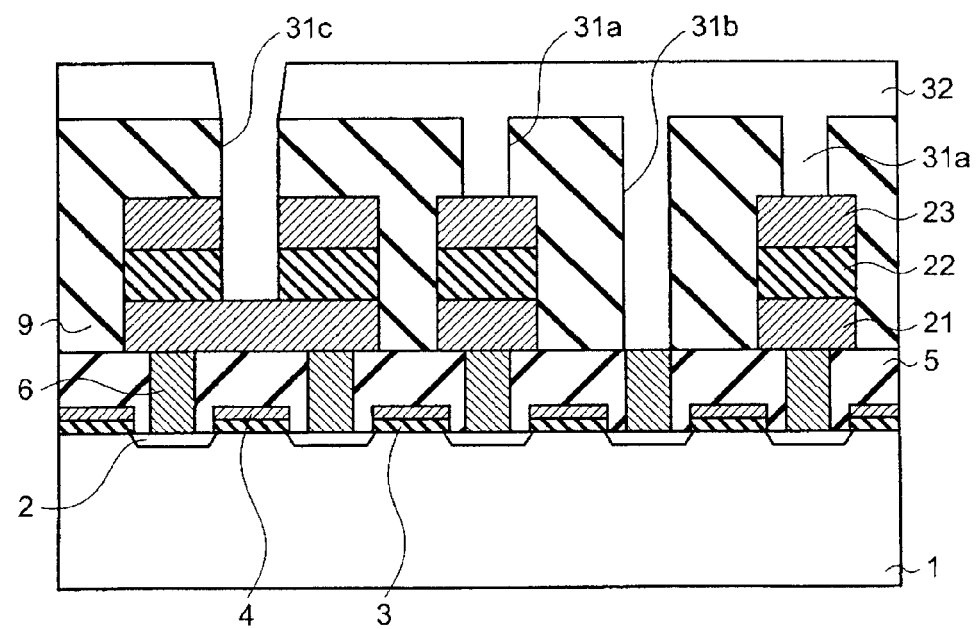
FIG. 13 is a cross sectional view showing a production process of the ferroelectric memory concerning Embodiment 2 of the present invention.

Next, as shown in FIG. 13, for the purpose of forming the via opening in the select transistor section, the resist film 32 is formed using the well-known lithography technique. At this time, the openings 31a and 31b are covered with the resist film 32. With this resist film 32 as a mask, by etching using the RIE method, for example, the interlayer insulating film 9, upper electrode film 23, and ferroelectric film 22 are removed so as to expose the lower electrode film 21, to thereby form the opening 31c. This resist film 32 is removed after the RIE.

Figure 14:
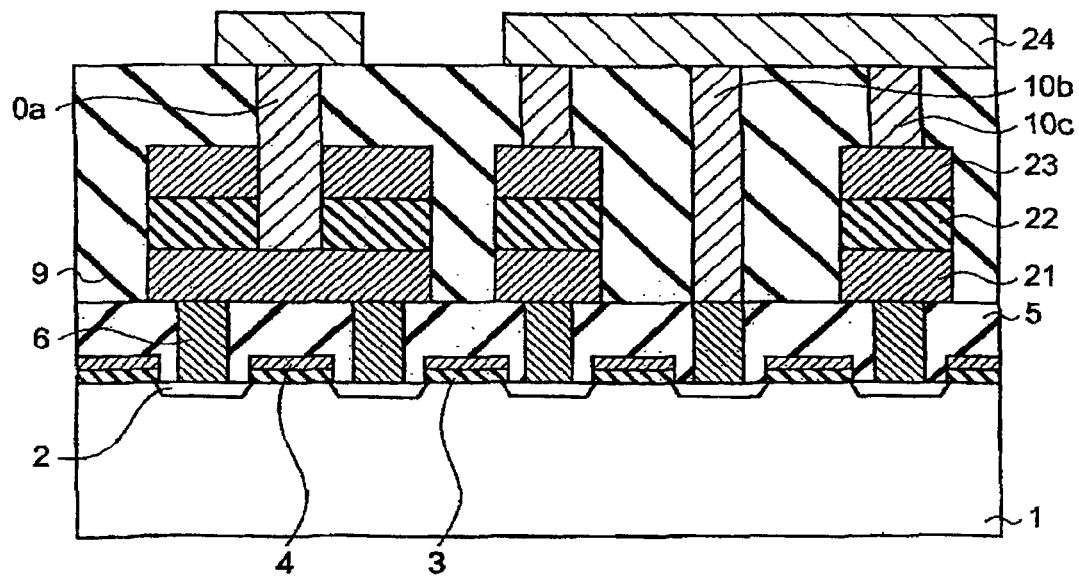
FIG. 14 is a cross sectional view showing a production process of the ferroelectric memory concerning Embodiment 2 of the present invention.

Then, as shown in FIG. 14, the via (plug) 10c is embedded into the opening 31a, the via (plug) 10b is embedded into the opening 31b, and the via (plug) 10a is embedded into the opening 31c, respectively. The wiring layer 24 connected to the via (plug) 10a is provided on the via (plug) 10a and interlayer insulating film 9. The wiring layer 24 connected to the vias (plug) 10b and 10c and interlayer insulating film 9 is provided on the vias (plug) 10b and 10c and interlayer insulating film 9.

Next, the interlayer insulating film 25 is formed on the interlayer insulating film 9 and the wiring layer 24. The interlayer insulating film 25 on the via (plug) 10a in the jumper wiring section is opened by etching so as to expose the wiring layer 24. Then, the via (plug) 26 is embedded into the opening. On the via (plug) 26 and interlayer insulating film 25, a wiring layer 27 as the bit line BL to be connected to the via (plug) 26 is formed. After the formation of the wiring layer 27, an interlayer insulating film, a wiring layer, and the like are formed using the well-known technique to complete the ferroelectric memory 40a as a chain FeRAM.

As described above, in the semiconductor memory device and a method of producing the semiconductor memory device according to this embodiment, a jumper wiring section configured of the lower electrode film 21, ferroelectric film 22, upper electrode film 23, and via 10a as the bit line contact BLC1 is provided in the select transistor section. The via 10a is embedded into the opening where the interlayer insulating film 9, upper electrode film 23, and ferroelectric film 22 are opened by etching. The upper part of the via 10a is connected to the bit line BL, and the lower part of the via 10a is connected to the lower electrode film 21 that is in contact with the via 6 on the source/drain region 2. In the memory cell section, a plurality of memory cells, in each of which a memory transistor and a ferroelectric capacitor are connected in parallel to each other, are connected in series. A ferroelectric capacitor, in which the lower electrode film 21, ferroelectric film 22, and upper electrode film 23 are laminated, is formed and connected to the via 6 on the source/drain region 2.

Accordingly, the jumper wiring in the select transistor section can be formed by adding a minimum number of process steps. As a consequence, even if the downsizing of the chain FeRAM progresses, the area of the select transistor section can be reduced with the same scalability as that of the memory cell section.

In this embodiment, although the openings 31a and 31b are formed first, the formation order of the openings 31a, 31b and the opening 31c may be reversed to form the opening 31c first.

Embodiment 3

Figure 15:
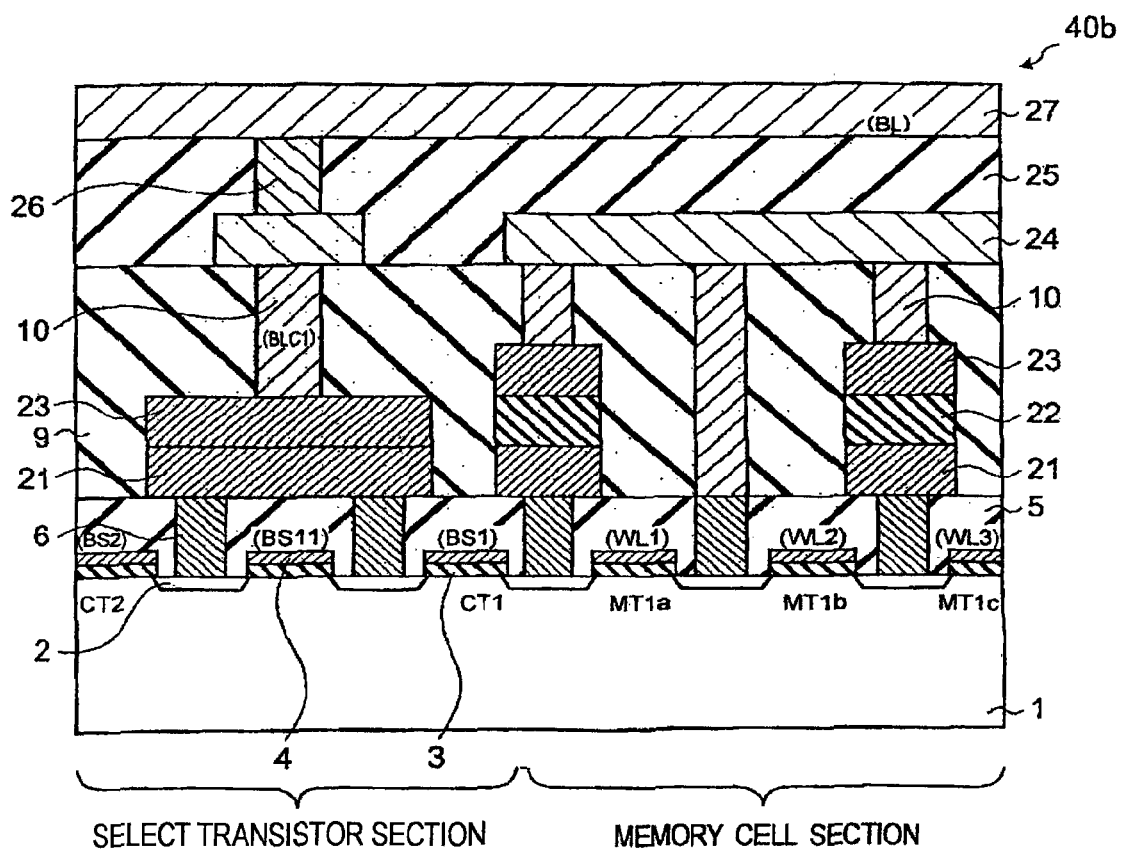
FIG. 15 is a cross sectional view showing a memory cell section and a select transistor section of a ferroelectric memory concerning Embodiment 3 of the present invention.

Next, a semiconductor memory device and a method of producing the semiconductor memory device concerning Embodiment 3 of the present invention are described with reference to the accompanying drawings. FIG. 15 is a cross sectional view showing a memory cell section and a select transistor section of the ferroelectric memory. In this embodiment, the structure of the jumper wiring section of the chain FeRAM as a ferroelectric memory is modified.

Hereinafter, component parts identical to those of Embodiment 1 are given the same reference numerals to omit the description thereof, and only different portions are described.

As shown in FIG. 15, in a ferroelectric memory (chain FeRAM) 40b, the lower electrode film 21 to be connected to the via (plug) 6 is provided above the select line BS11. The lower electrode film 21 to be connected to the via (plug) 6 is also provided above the source/drain region 2 between the select transistor CT1 and the memory transistor MT1a. Also, the lower electrode film 21 to be connected to the via (plug) 6 is provided above the source/drain region 2 between the memory transistor MT1b and the memory transistor MT1c. On the lower electrode film 21 in the select transistor section, the upper electrode film 23 to be connected to the lower electrode film 21 is formed. On the lower electrode film 21 in the memory cell section, the ferroelectric film 22 and the upper electrode film 23 are laminated. The interlayer insulating film 9 is provided on the laminated lower electrode film 21 and upper electrode film 23 in the select transistor section, on the laminated lower electrode film 21, ferroelectric film 22 and upper electrode film 23 in the memory cell section, and on the interlayer insulating film 5.

On the upper electrode film 23 provided above the select line BS11, an opening is provided so as to expose the upper electrode film 23. Then, the via (plug) 10 as the bit line contact BLC1 is embedded into this opening. On the via (plug) 6 between the memory transistor MT1a and the memory transistor MT1b, an opening is provided so as to expose the via (plug) 6. Then, the via (plug) 10 is embedded into this opening. On the upper electrode films 23 between the select transistor CT1 and the memory transistor MT1a as well as between the memory transistor MT1b and the memory transistor MT1c, an opening is provided so as to expose the upper electrode film 23, respectively. Then, the via (plug) 10 is embedded into this opening. Here, the vias (plug) 10 in the select transistor section are connected to the upper electrode film 23, respectively, whereby each portion configured of the via (plug) 10, upper electrode film 23, and lower electrode film 21 functions as the jumper wiring section.

The wiring layer 24 to the via (plug) 10 is provided on the via (plug) 10 in the select transistor section. Also, the wiring layer 24 to be connected to the via (plug) 10 is provided on the via (plug) 10 in the memory cell section. The interlayer insulating film 25 is provided on the interlayer insulating film 9 and the wiring layer 24. On the wiring layer 24 connected to the via (plug) 10a in the select transistor section, an opening is provided so as to expose the wiring layer 24. Then, the via (plug) 26 is embedded into this opening. On the interlayer insulating film 25 and the via (plug) 26, the wiring layer 27 as the bit line BL to be connected to the via (plug) 26 is provided.

Figure 16:
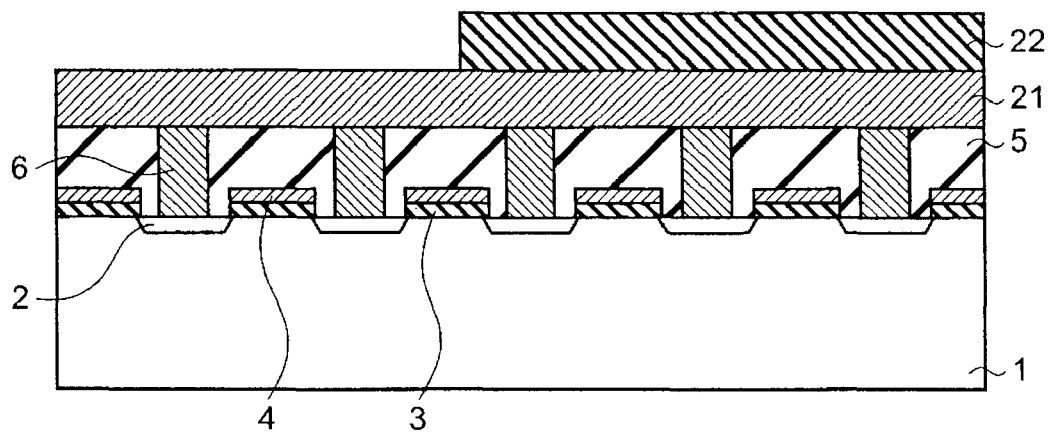
FIG. 16 is a cross sectional view showing a production process of the ferroelectric memory concerning Embodiment 3 of the present invention.
Figure 17:
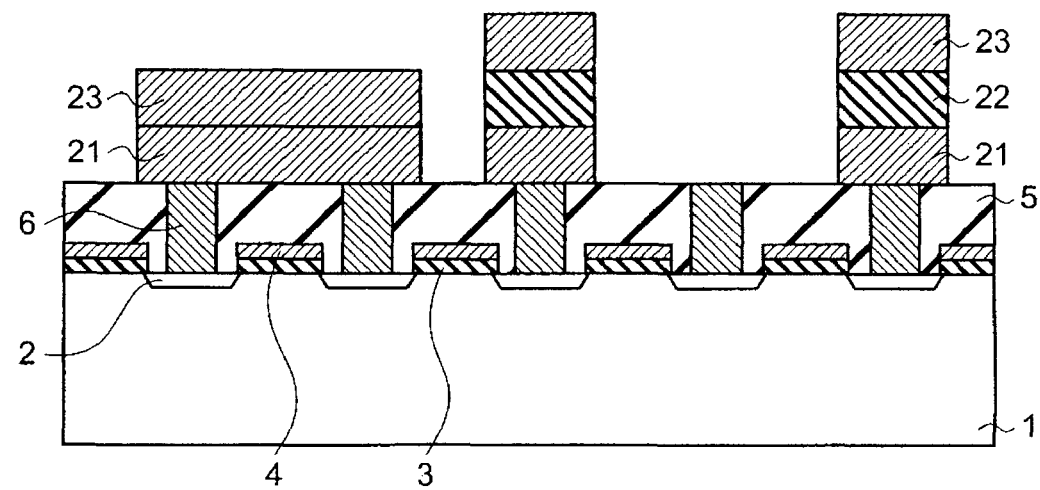
FIG. 17 is a cross sectional view showing a production process of the ferroelectric memory concerning Embodiment 3 of the present invention.

Next, a method of producing the ferroelectric memory is described with reference to FIG. 16 and FIG. 17. FIG. 16 and FIG. 17 are cross sectional views showing the production process of the ferroelectric memory. Here, since the steps up to the step of forming the ferroelectric capacitor are the same as those of Embodiment 1, the description thereof is omitted.

As shown in FIG. 16, the lower electrode film 21 and the ferroelectric film 22 are successively laminated. Then, by etching using the RIE method, for example, the ferroelectric film 22 in the select transistor section is removed. In the RIE, it is preferable to use the condition under which the etching rate of the ferroelectric film 22 can be made higher than that of the lower electrode film 21 (that is, the selection ratio is high).

Next, as shown in FIG. 17, the upper electrode film 23 is formed. The upper electrode films 23, ferroelectric films 22, and lower electrode films 21 in portions except those in regions serving as the jumper wiring section and the ferroelectric capacitor are removed by etching using the RIE method, for example. Since the ferroelectric film 22 is not formed in the select transistor section, in the RIE it is preferable to use the condition under which the etching rates of the lower electrode film 21, ferroelectric film 22, and upper electrode film 23 can be made higher than that of the interlayer insulating film 5 (that is, the selection ratio is high).

Subsequently, the interlayer insulating film 9 is formed on the interlayer insulating film 5, the lower electrode film 21, the ferroelectric film 22, and the upper electrode film 23. An opening is provided by etching and opening the interlayer insulating film 9 on the upper electrode film 23 in the select transistor section. An opening is also provided by etching and opening the interlayer insulating film 9 on the upper electrode film 23 in the memory cell section. Also, an opening is provided by etching and opening the interlayer insulating film 9 on the via (plug) 6 between the memory transistor MT1a and the memory transistor MT1b. The via (plug) 10 is embedded into each of the formed opening.

Then, the wiring layer 24 to be connected to the via (plug) 10 is formed on the via (plug) 10 and interlayer insulating film 9 in the select transistor section, and on the via (plug) 10 and the interlayer insulating film 9 in the memory cell section, respectively. The interlayer insulating film 25 is formed on the interlayer insulating film 9 and the wiring layer 24. The interlayer insulating film 25 on the via (plug) 10a in the jumper wiring section is opened by etching so as to expose the via (plug) 10a. Then, the via (plug) 26 is embedded into the opening. On the via (plug) 26 and the interlayer insulating film 25, the wiring layer 27 as the bit line BL to be connected to the via (plug) 26 is formed. After the formation of the wiring layer 27, an interlayer insulating film, a wiring layer, and the like are formed using the well-known technique to complete the ferroelectric memory 40b as a chain FeRAM.

As described above, in the semiconductor memory device and a method of producing the semiconductor memory device according to this embodiment, a jumper wiring section configured of the lower electrode film 21, upper electrode film 23, and via 10a as the bit line contact BLC1 is provided in the select transistor section. The via 10 is embedded into the opening where the interlayer insulating film 9 is opened by etching. The upper part of the via 10 is connected to the bit line BL, and the lower part of the via 10 is connected to the upper electrode film 23. The upper electrode film 23 is connected to the via 6 on the source/drain region 2 via the lower electrode film 21. In the memory cell section, a plurality of memory cells, in each of which a memory transistor and a ferroelectric capacitor are connected in parallel to each other, are connected in series. A ferroelectric capacitor, in which the lower electrode film 21, the ferroelectric film 22, and the upper electrode film 23 are laminated, is formed and connected to the via 6 on the source/drain region 2.

Accordingly, the jumper wiring in the select transistor section can be formed by adding a minimum number of process steps, so that even if the downsizing of the chain FeRAM progresses, the area of the select transistor section can be reduced with the same scalability as that of the memory cell section.

As described above, present embodiments provide a semiconductor memory device and a method of producing the semiconductor memory device, which device achieves downsizing of a memory cell as well as downsizing of the area of a jumper wiring in a select transistor section of a unit cell.

The present invention is not limited to the above-described embodiments, but various modifications may be made within the spirit and scope of the present invention.

For example, the present invention has been employed for the chain FeRAM in the above-described embodiments; however, the present invention can be employed for a chain type phase change random access memory (PRAM) and the like, as well. Moreover, although in Embodiment 3 the jumper wiring section in the select transistor section is configured of the via (plug) 10 as the bit line contact BLC1, the upper electrode film 23, and the lower electrode film 21, it may be configured of the via (plug) 10 as the bit line contact BLC1 and the upper electrode film 23, or may be configured of the via (plug) 10 as the bit line contact BLC1 and the lower electrode film 21.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
   a semiconductor substrate;
   a memory cell section comprising:
      a memory transistor provided on the semiconductor substrate, the memory transistor including a first gate electrode provided on the semiconductor substrate with a gate insulating film interposed therebetween, and a source and drain provided at both sides of the first gate electrode on the semiconductor substrate, and
      a ferroelectric capacitor provided above the memory transistor, the ferroelectric capacitor including a first electrode film connected to any one of a source and drain of the memory transistor, a second electrode film connected to the other one of the drain and source of the memory transistor, and a ferroelectric film contacting a side surface of the first electrode film and contacting a side surface of the second electrode film,
      the memory cell section having the memory transistor and the ferroelectric capacitor connected in parallel to each other; and
   a select transistor section, comprising:
      a select transistor provided at an end of the memory cell section, the select transistor including a second gate electrode provided on the semiconductor substrate with the gate insulating film interposed therebetween, and a source and drain provided at both sides of the second gate electrode on the semiconductor substrate, and
      a third electrode film connected to the source and drain of the select transistor and connected to a bit line via a bit line contact.

2. The semiconductor memory device according to claim 1, wherein the first, second, and third electrode films include the same material and have the same film quality.

3. The semiconductor memory device according to claim 2, wherein the first, second, and third electrode films are made of Pt (platinum), Ir (iridium) or $IrO_2$.

4. The semiconductor memory device according to claim 1, wherein the ferroelectric film is made of lead zirconate titanate ($PbZrTiO_3$), strontium bismuth tantalate ($SrBi_2Ta_2O_9$) or lanthanum additive bismuth titanate ($(Bi, La)_4Ti_3O_{12}$).

5. The semiconductor memory device according to claim 1, wherein the memory cell section has a plurality of memory cells connected in series, the plurality of memory cells each including the memory transistor and the ferroelectric capacitor connected in parallel to each other.

6. A semiconductor memory device, comprising:
   a semiconductor substrate;
   a memory cell section, comprising:
      a memory transistor provided on the semiconductor substrate, the memory transistor including a first gate electrode provided on the semiconductor substrate with a gate insulating film interposed therebetween, and a source and drain provided at both sides of the first gate electrode on the semiconductor substrate, and
      a ferroelectric capacitor in which a first lower electrode film, a first ferroelectric film and a first upper electrode film are formed by deposition, the first lower electrode film connected to any one of the source and drain of the memory transistor,
      the memory cell section having the memory transistor and the ferroelectric capacitor connected in parallel to each other; and
   a select transistor section, comprising:
      a select transistor provided at an end of the memory cell section, the select transistor including a second gate electrode provided on the semiconductor substrate with the gate insulating film interposed therebetween, and a source and drain provided at both sides of the second gate electrode on the semiconductor substrate, and
      a jumper wiring section including a second lower electrode film, a second ferroelectric film formed on the second lower electrode film, a second upper electrode film formed on the second ferroelectric film, and a bit line contact, the second lower electrode connected to the source and drain of the select transistor, and the bit line contact connected to the second lower electrode and a side surface of the bit line contact contacted to the second ferroelectric film.

7. The semiconductor memory device according to claim 6, wherein the first and second lower electrode films include the same material and have the same film quality.

8. The semiconductor memory device according to claim 7, wherein the first and second lower electrode films are made of Pt (platinum), Ir (iridium) or $IrO_2$.

9. The semiconductor memory device according to claim 6, wherein the first and second ferroelectric films include the same material and have the same film quality.

10. The semiconductor memory device according to claim 9, wherein the first and second ferroelectric films are made of lead zirconate titanate ($PbZrTiO_3$), strontium bismuth tantalate ($SrBi_2Ta_2O_9$) or lanthanum additive bismuth titanate ($(Bi, La)_4Ti_3O_{12}$).

11. The semiconductor memory device according to claim 6, wherein the first and second upper electrode films include the same material and have the same film quality.

12. The semiconductor memory device according to claim 11, wherein the first and second upper electrode films are made of Pt (platinum), Ir (iridium) or $IrO_2$.

13. The semiconductor memory device according to claim 6, wherein the memory cell section has a plurality of memory cells connected in series, the plurality of memory cells each including the memory transistor and the ferroelectric capacitor connected in parallel to each other.

14. A semiconductor memory device, comprising:
a semiconductor substrate;
a memory cell section, comprising:
- a memory transistor provided on the semiconductor substrate, the memory transistor including a first gate electrode provided on the semiconductor substrate with a gate insulating film interposed therebetween, and a source and drain provided at both sides of the first gate electrode on the semiconductor substrate, and
- a ferroelectric capacitor in which a first lower electrode film, a ferroelectric film, and a first upper electrode film are formed by deposition, the first lower electrode film connected to any one of the source and drain of the memory transistor,
- the memory cell section having the memory transistor and the ferroelectric capacitor connected in parallel to each other; and a select transistor section, comprising:
- a select transistor provided at an end of the memory cell section, the select transistor including a second gate electrode provided on the semiconductor substrate with the gate insulating film interposed therebetween, and a source and drain provided at both sides of the second gate electrode on the semiconductor substrate, and
- a jumper wiring section including a second lower electrode film, a second upper electrode film formed on the second lower electrode film, and a bottom surface of the second upper electrode film contacting to a top surface of the second lower electrode film and a bit line contact, the second lower electrode connected to the source and drain of the select transistor, and the bit line contact connected to a top surface of the second upper electrode.

15. The semiconductor memory device according to claim 14, wherein the first and second lower electrode films include the same material and have the same film quality.

16. The semiconductor memory device according to claim 15, wherein the first and second lower electrode films are made of Pt (platinum), Ir (iridium) or $IrO_2$.

17. The semiconductor memory device according to claim 14, wherein the ferroelectric film is made of lead zirconate titanate ($PbZrTiO_3$), strontium bismuth tantalate ($SrBi_2Ta_2O_9$) or lanthanum additive bismuth titanate (($Bi, La)_4Ti_3O_{12}$).

18. The semiconductor memory device according to claim 14, wherein the first and second upper electrode films include the same material and have the same film quality.

19. The semiconductor memory device according to claim 18, wherein the first and second upper electrode films are made of Pt (platinum), Ir (iridium) or $IrO_2$.

20. The semiconductor memory device according to claim 14, wherein the memory cell section has a plurality of memory cells connected in series, the plurality of memory cells each including the memory transistor and the ferroelectric capacitor connected in parallel to each other.

* * * * *